(12) United States Patent
Reid et al.

(10) Patent No.: US 9,993,838 B2
(45) Date of Patent: Jun. 12, 2018

(54) METHOD OF CALIBRATING A DISPENSER

(71) Applicant: Illinois Tool Works Inc., Glenview, IL (US)

(72) Inventors: Scott A. Reid, Bradford, MA (US); Thomas J. Karlinski, Atkinson, NH (US); Jonathan Joel Bloom, North Falmouth, MA (US); Thomas C. Prentice, Westford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days. days.

(21) Appl. No.: 15/788,226

(22) Filed: Oct. 19, 2017

(65) Prior Publication Data

US 2018/0036762 A1 Feb. 8, 2018

Related U.S. Application Data

(62) Division of application No. 14/630,366, filed on Feb. 24, 2015, now Pat. No. 9,815,081.

(51) Int. Cl.
*B05C 5/00* (2006.01)
*B05C 5/02* (2006.01)
*H05K 3/00* (2006.01)
*H05K 3/12* (2006.01)
*G01B 11/14* (2006.01)
(Continued)

(52) U.S. Cl.
CPC ............ *B05C 21/00* (2013.01); *G01B 11/14* (2013.01); *G06T 7/0006* (2013.01); *G06T 7/80* (2017.01); *H04N 5/2253* (2013.01); *H04N 7/185* (2013.01); *H05K 3/0008* (2013.01); *H05K 13/0469* (2013.01); *H05K 13/08* (2013.01); *G06T 2207/30108* (2013.01); *G06T 2207/30232* (2013.01); *H05K 3/4676* (2013.01); *H05K 2201/09918* (2013.01);
(Continued)

(58) Field of Classification Search
None
See application file for complete search history.

(56) References Cited

U.S. PATENT DOCUMENTS 3,777,197 A 12/1973 Preston et al.
5,614,024 A * 3/1997 Ishida .................. B05B 12/084
118/697
(Continued)

FOREIGN PATENT DOCUMENTS

DE 3805841 A1 8/1989
DE 197 12 879 A1 10/1998
(Continued)

*Primary Examiner* — Lisha Jiang
(74) *Attorney, Agent, or Firm* — Lando & Anastasi, LLP

(57) ABSTRACT

A method is used to identify and compensate for errors created by changes in the relative positions of a deposition unit and a vision system of a dispenser. The method includes calibrating the vision system, dispensing a pattern of features over a working area, moving the vision system over a deposition location to locate a deposition, obtaining an image of the deposition, tagging data associated with the image, calculating a relative distance between the deposition unit and the vision system, storing correction data with spatial location in a file for later use, and using the stored data to make small corrections prior to dispensing additional material.

7 Claims, 3 Drawing Sheets

(51) Int. Cl.
*G06T 7/00* (2017.01)
*B05C 21/00* (2006.01)
*H04N 7/18* (2006.01)
*H04N 5/225* (2006.01)
*H05K 13/08* (2006.01)
*H05K 13/04* (2006.01)
*G06T 7/80* (2017.01)
*H05K 3/46* (2006.01)

(52) U.S. Cl.
CPC ............. *H05K 2203/0126* (2013.01); *H05K 2203/0545* (2013.01); *H05K 2203/166* (2013.01)

(56) References Cited

U.S. PATENT DOCUMENTS

| | | | |
|---|---|---|---|
| 5,747,102 A | 5/1998 | Smith et al. | |
| 5,938,871 A | 8/1999 | Nakahira et al. | |
| 6,007,631 A | 12/1999 | Prentice et al. | |
| 6,093,251 A | 7/2000 | Carr et al. | |
| 6,206,964 B1 | 3/2001 | Purcell et al. | |
| 6,224,675 B1 | 5/2001 | Prentice et al. | |
| 6,322,854 B1 | 11/2001 | Purcell et al. | |
| 6,395,334 B1 | 5/2002 | Prentice et al. | |
| 6,541,063 B1 | 4/2003 | Prentice et al. | |
| 7,100,147 B2 | 8/2006 | Miller et al. | |
| 7,833,572 B2 | 11/2010 | Read | |
| 7,923,056 B2 | 4/2011 | Read | |
| 8,230,805 B2 | 7/2012 | Read | |
| 2005/0056215 A1 | 3/2005 | Shimoda | |
| 2006/0176327 A1 | 8/2006 | Holm et al. | |
| 2006/0177564 A1 | 8/2006 | Diaz et al. | |
| 2006/0193969 A1 | 8/2006 | Prentice et al. | |
| 2008/0105703 A1 | 5/2008 | Prentice et al. | |
| 2008/0296311 A1 | 12/2008 | Read | |
| 2008/0296315 A1 | 12/2008 | Read | |
| 2009/0078720 A1 | 3/2009 | Abernathy et al. | |

FOREIGN PATENT DOCUMENTS

| | | |
|---|---|---|
| DE | 10 2005 045 161 A1 | 4/2007 |
| EP | 1806962 A2 | 7/2007 |
| GB | 2462398 A | 2/2010 |
| JP | S63270574 A | 11/1988 |
| JP | 5-090799 A | 4/1993 |
| JP | 05185004 | 7/1993 |
| JP | H0824749 A | 1/1996 |
| JP | 2002346452 A | 12/2002 |
| JP | 2003152394 A | 5/2003 |

* cited by examiner

METHOD OF CALIBRATING A DISPENSER

RELATED APPLICATIONS

This application is a divisional of U.S. patent application Ser. No. 14/630,366, filed Feb. 24, 2015 (now U.S. Pat. No. 9,815,081), entitled METHOD OF CALIBRATING A DISPENSER, which is incorporated herein by reference in its entirety.

BACKGROUND OF THE DISCLOSURE

1. Field of the Disclosure

This disclosure relates generally to apparatus and methods for dispensing a viscous material on a substrate, such as a printed circuit board, and more particularly to a system and related methods for accurately dispensing material on the circuit board. This may be done within a dedicated dispenser system or a dispense unit mounted within a screen/stencil printer.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing very small amounts, or dots, of viscous material onto a circuit board. The viscous material may include liquid epoxy or solder paste, or some other related material. Prior to performing a dispensing operation, the circuit board must be aligned or otherwise registered with a dispenser of the dispensing system. In one known method, this may be achieved by employing a vision system of the dispensing system to verify the location of landmarks, otherwise known as fiducials, or by locating known components on the circuit board. Specifically, to align the circuit board with the dispensing unit of the dispensing system, images of at least two fiducials or a known component are taken by a camera of the vision system. If the circuit board is out of position, a gantry capable of moving the dispenser may be manipulated to account for the actual position of the circuit board. In another embodiment, a support surface upon which the circuit board rests may be manipulated to accurately position the circuit board prior to performing a dispense operation.

One issue associated with dispensing is that a distance/relationship between the vision system and the dispensing unit may not be constant, due to potential non-linearity or non-orthogonality. This issue may lead to significant errors when attempting to accurately dispense material onto the circuit board. Every mechanical system has some amount of variance from a zero or perfect tolerance. A typical mechanical motion system is designed to achieve high tolerances of flat, straight and square over the travel of the system. These tolerances allow for some level of variation from system to system and from a perfect tolerance. A typical dispenser may employ a standard calibration routine, which will calibrate out these errors using the vision system of the dispenser. This calibration routine can be verified to correct these errors for the vision system positioning. However, the calibration routine does not sufficiently account for a relative distance between the vision system and the dispensing unit that is not constant over the entire travel of the system. In other cases, the dispense unit may be coupled to a separate mechanical motion system than the vision system, and thus a calibration of each system and the relationship between the two systems is required.

SUMMARY OF THE DISCLOSURE

One aspect of the present disclosure is directed to a method used to identify and compensate for errors created by changes in the relative positions of a deposition unit and a vision system of a dispenser. In one embodiment, the method comprises: calibrating the vision system; dispensing a pattern of features over a working area; moving the vision system over a deposition location to locate a deposition; obtaining an image of the deposition; tagging data associated with the image; calculating a relative distance between the deposition unit and the vision system; storing correction data with spatial location in a file for later use; and using the stored data to make small corrections prior to dispensing additional material.

Embodiments of the method further may include, if multiple dispensing units are employed, tagging each dispensing unit. The steps of obtaining an image of the deposition, tagging data associated with the image, saving the data, and calculating a relative distance may be repeated for other deposition locations. The method may be performed under the control of a controller configured to manipulate the vision system with a vision gantry system to move to a position defined by the deposition location. The controller further may be configured to dispense lines of material. The controller further may be configured to dispense dots of material. The method further may comprise supporting the electronic substrate during a dispense operation with a support assembly coupled to the frame. The dispensing unit and the vision system may be coupled to a common gantry. The dispensing unit and the vision system may be provided on separate gantries.

Another aspect of the disclosure is directed to a method used to identify and compensate for errors created by changes in the relative positions of a deposition unit and a vision system of a dispenser. In one embodiment, the method comprises: calibrating the vision system; temporarily fixing a camera on a deposition unit; moving a camera at a deposition unit location to the same location as the vision system was calibrated; obtaining an image of same standard which the vision system was calibrated to; tagging data associated with the image; calculating a relative distance between the deposition unit and the vision system; storing correction data with spatial location in a file for later use; and using the stored data to make corrections prior to dispensing additional material.

Embodiments of the method further may include, if multiple dispensing units are employed, tagging each dispensing unit. The steps of obtaining an image of the deposition, tagging data associated with the image, saving the data, and calculating a relative distance may be repeated for other deposition locations. The method may be performed under the control of a controller configured to manipulate the vision system with a vision gantry system to move to a position defined by the calibration location. The method further may comprise supporting the electronic substrate during a dispense operation with a support assembly coupled to the frame. The dispensing unit and the vision system may be coupled to a common gantry. The dispensing unit and the vision system may be provided on separate gantries. The method further may comprise removing the camera.

BRIEF DESCRIPTION OF THE DRAWINGS

The accompanying drawings are not intended to be drawn to scale. In the drawings, each identical or nearly identical

Figure 1:
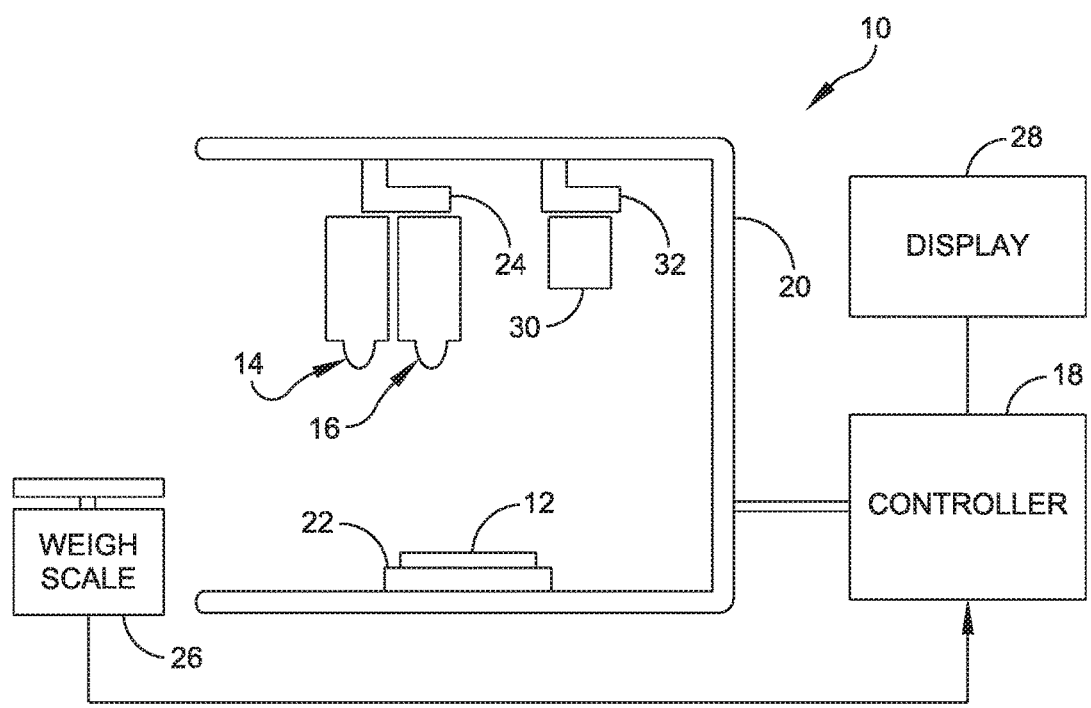
Figure 2:
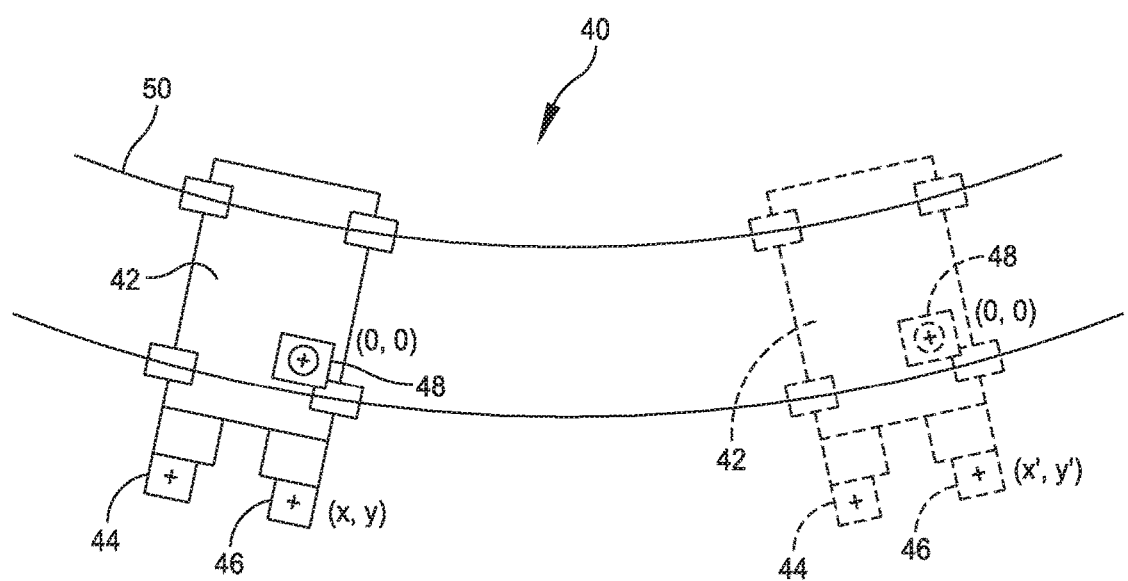
Figure 3:
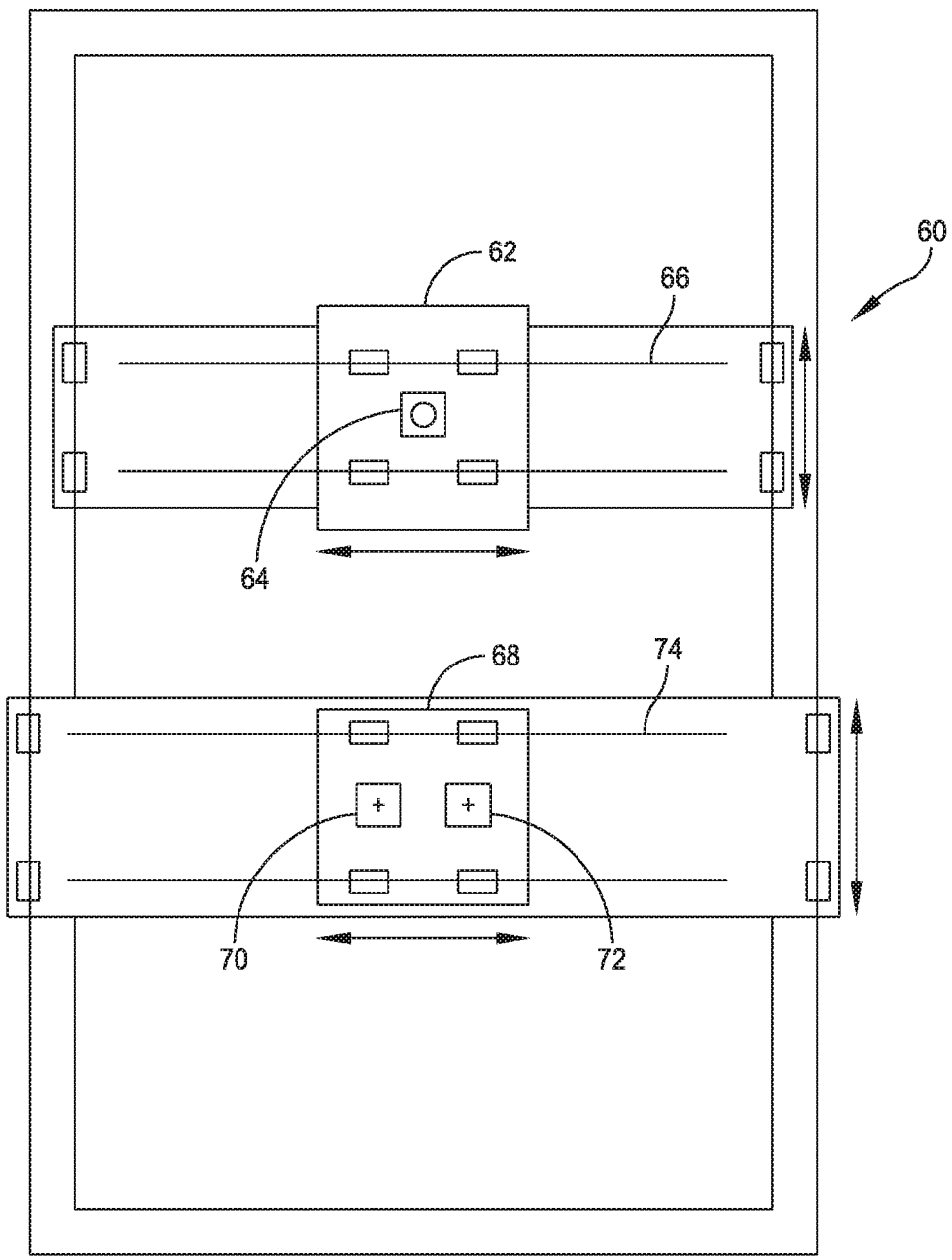

3 component that is illustrated in various figures is represented by a like numeral. For purposes of clarity, not every component may be labeled in every drawing. In the drawings:

FIG. 1 is a schematic view of a dispenser of an embodiment of the present disclosure;

FIG. 2 is a schematic view of the movement of a vision system and two dispensing units on a common gantry system of the dispenser; and FIG. 3 is a schematic view of the movement of a vision system and two dispensing units on separate gantries within the same main dispenser.

DETAILED DESCRIPTION OF THE DISCLOSURE

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to viscous material dispensing systems, devices including dispensing systems, and methods of calibrating the dispenser prior to performing a dispensing operation on a substrate. Embodiments disclosed herein are directed to techniques for dispensing material on an electronic substrate by dispensing a pattern of dispensed features and then locating the dispensed features with a vision system to determine small differences.

FIG. 1 schematically illustrates a dispenser, generally indicated at 10, according to one embodiment of the present disclosure. The dispenser 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications or for applying conductive inks. It should be understood that references to viscous or semi-viscous materials, as used herein, are exemplary and intended to be non-limiting. The dispenser 10 includes first and second dispensing units or heads, generally indicated at 14 and 16, respectively, and a controller 18 to control the operation of the dispenser. Although two dispensing units are shown, it should be understood that one or more dispensing units may be provided.

The dispenser 10 may also include a frame 20 having a base or support 22 for supporting the substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispenser 10 to control loading and unloading of substrates to and from the dispenser. The gantry 24 can be moved using motors under the control of the controller 18 to position the dispensing units 14, 16 at predetermined locations over the substrate. The dispenser 10 may include a display unit 28 connected to the controller 18 for displaying various information to an operator. There may be an optional second controller for controlling the dispensing units. Also, each dispensing unit 14, 16 can be configured with a z-axis sensor to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the substrate, e.g., printed circuit board, must be aligned or otherwise in registration with a dispenser of the dispensing system. The dispenser further includes a vision system 30, which, in one embodiment, is coupled to a vision system gantry 32 movably coupled to the frame 20 for supporting and moving the vision system. This embodiment is also illustrated in FIG. 3. In another embodiment, which is shown in FIG. 2, the vision system 32 may be provided on the dispensing unit gantry 24. As described, the vision system 30 is employed to verify the location of landmarks, known as fiducials, or components on the substrate. Once located, the controller can be programmed to manipulate the movement of one or more of the dispensing units 14, 16 to dispense material on the electronic substrate.

Systems and methods of the present disclosure are directed to dispensing material onto a substrate, e.g., a circuit board, by locating an object provided on the substrate with both location and angular components. The description of the systems and methods provided herein reference exemplary electronic substrates 12 (e.g., printed circuit boards), which are supported on the support 22 of the dispenser 10. In one embodiment, the dispense operation is controlled by the controller 18, which may include a computer system configured to control material dispensers. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

As mentioned above, in some dispensers, the dispensing unit may be positioned on the same motion system as the vision system. With this configuration, a relative distance between the dispensing unit and the vision systems is calibrated at one location in the system. As mentioned above, an issue associated with performing a typical calibration routine is that this relative distance/relationship is not constant over the entire travel of the system.

FIG. 2 illustrates a top down view of a portion of such a dispenser system. As shown, a system, generally indicated at 50, includes a carriage 42 configured to support two disposition units 44, 46 and a vision system 48. The carriage 42 is configured to ride along a gantry 50. If the travel of the gantry 50 is not perfectly straight, which is greatly exaggerated in FIG. 2, a relative X, Y relationship between the vision system 48 (0, 0) and the dispensing units 44, 46, e.g., dispensing unit 46 (x, y) is not constant.

As shown, when the dispensing units 44, 46 and the vision system 48 travel on the gantry 50, the relative distance between vision system 48 (0, 0) and the dispensing units 44, 46 e.g., dispensing unit 46 (x', y'), changes. This example demonstrates a single Cartesian plane in which the error occurs. However, this error can occur in all three spatial Cartesian planes, and can be corrected for if properly measured and by applying a compensation method of embodiments of the present disclosure.

FIG. 3 illustrates a top down view of a portion of another dispenser system, generally indicated at 60, including a vision carriage 62 configured to support a vision system 64. As shown, the vision carriage 62 is configured to ride along a vision gantry 66. The system 60 further includes a dispensing carriage 68 configured to support two dispensing units 70, 72. The dispensing carriage 68 is configured to ride along a separate dispensing gantry 74. In this case, each gantry 66, 74 would have to have its own calibration and error correction as well as a manner in which to accurately relate the two motion systems in order to coordinate the relative positions of the vision system 64 and the dispensing units 70, 72.

As the vision carriage 62 and the dispensing carriage 68 travel along their respective gantries 66, 74, the relative distance between vision system 64 and the dispensing units 70, 72, changes. As with the system 40, this example demonstrates a single Cartesian plane in which the error occurs. This error also can occur in all three spatial Cartesian planes, and can be corrected for if properly measured and by applying a compensation method of embodiments of the present disclosure.

In one embodiment, a method used to identify errors created by changes in the relative positions of the deposition unit and the vision system is described as follows. By incorporating a process referred to as "wet dispensing," a pattern of deposition features are deposited on the substrate, and then located with the vision system to determine small differences over the area. This method may be used after initially locating an actual deposition with the already calibrated vision system. This would map out actual errors relative to the changes in the relative positions of the deposition unit and the vision systems. The method may be used after assembling the dispenser, prior to being delivered to a customer at the assembler's manufacturing facility or could be repeated in the field.

In one embodiment, the method includes the following sequence of method steps. The dispenser is first calibrated using existing methods. In a certain embodiment, a calibration standard or plate having predetermined features fabricated from a known stable material at precise locations on the plate is mounted into the system base structure. The vision system is calibrated to the standard by moving to known coordinates, capturing and processing images and any calculated error associated with the actual position at which accurately known features are located is recorded. It should be understood that a vision system or camera can be mounted on at the dispensing unit location to calibrate the gantry system. Once calibrated, a pattern of features are dispensed on a critical working area, which can be any portion of a dispenser support surface accessible by the gantry system. Next, the vision system is moved over the deposition location to locate a deposition. Once positioned, the vision system obtains an image of the deposition and the image is processed appropriately. The vision system is then moved over sequential deposition locations to locate additional depositions. The data associated with the obtained images is tagged and recorded for the specific location and dispensing unit. This step is repeated for the other deposition locations if multiple dispensing pumps are employed in which data obtained for these images is tagged for each dispensing unit. For example, data may be tagged and recorded for dispensing unit #1 and separate data may be tagged and recorded for dispensing unit #2. Once saved, a relative distance between the dispensing unit and the vision system is calculated, and if multiple dispense units are provided, relative distances are calculated.

After calculating the relative distance or distances, the resulting error/correction data is stored with a spatial location in a file for later use. This stored data is used to make small corrections to all programmed depositions.

In another method, a camera may be temporarily mounted directly at the dispensing unit location. This method may be used when assembling and testing the dispenser or used in the field after the dispenser has been used for some period of time. In one embodiment, the method includes the following sequence of method steps. The dispenser vision system is first calibrated using existing methods, then a temporary vision system mounted at the dispense location is calibrated by the same method. As with the prior method, a calibration standard or plate having predetermined features fabricated from a known stable material at precise locations on the plate is mounted into the system base structure. The vision system is calibrated to the standard by moving to known coordinates, capturing and processing images and any calculated error associated with the actual position at which accurately known features are located is recorded. A separate vision system or camera is temporarily mounted at the dispensing unit location to calibrate the location of the dispensing unit. Next the camera which is mounted at the dispense unit location is positioned at the same locations that the machine vision system was calibrated and any calculated error associated with the actual position at which accurately known features are located is recorded. The data associated with the obtained images is tagged and recorded for the vision system and each specific dispensing unit. This step is repeated for the other dispense unit locations if multiple dispense units are employed in which data obtained for these images is tagged for each dispensing unit. For example, data may be tagged and recorded for dispensing unit #1 and separate data may be tagged and recorded for dispensing unit #2. Once saved, a relative distance between the dispensing head and the vision system is calculated, and if multiple dispensing heads are provided, relative distances are calculated.

After calculating the relative distance or distances, the resulting error/correction data is stored with a spatial location in a file for later use. This stored data is used to make small corrections to all programmed depositions.

Either method can be used during the manufacturing process and/or repeated in the field after some period of time. The first method may be associated the actual deposition unit and the vision system, while second method may be used to approximate the results of the first method.

The computer system may include an operating system that manages at least a portion of the hardware elements included in the computer system. Usually, a processor or controller executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and the embodiments disclosed herein are not intended to be limited to any particular implementation.

The processor and operating system together define a computer platform for which application programs in high level programming languages may be written. These component applications may be executable, intermediate, for example, C-, bytecode or interpreted code which communicates over a communication network, for example, the Internet, using a communication protocol, for example, TCP/IP. Similarly, aspects in accord with the present disclosure may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present disclosure may be implemented in a non-programmed environment, for example, documents created in HTML, XML or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the disclosure is not limited to a specific programming language and any suitable programming language could also be used.

It should be noted that systems and methods described herein may be performed on objects other than mega pixel cameras. For example, the method may be performed on any type of electronic component mounted on an electronic substrate. The geometry of the object should be known prior to performing the method.

Moreover, the systems and methods described herein may be employed within any type of linear or non-linear motion system, and are not limited to Cartesian gantry systems. For example, the calibration methods disclosed herein may be employed on a dispenser having a robot arm or a radial/rotational motion system.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method used to identify and compensate for errors created by changes in the relative positions of a deposition unit and a vision system of a dispenser, the method comprising:
   calibrating the vision system using a calibration plate by identifying calibration locations on the calibration plate;
   temporarily mounting a camera at a location of the deposition unit;
   moving the camera from the location of the deposition unit to the calibration locations used to calibrate the vision system on the calibration plate;
   obtaining an image of the calibration locations using the camera;
   tagging data associated with the image to obtain tagged data;
   calculating a relative distance between the location of the deposition unit and the vision system based on the tagged data to obtain correction data;
   storing the correction data with spatial location in a file for later use; and
   using the stored data to make corrections prior to dispensing material onto a substrate.

2. The method of claim 1, further comprising, if multiple deposition units are employed, tagging data associated with an image of the calibration locations obtained by the camera for each deposition unit.

3. The method of claim 1, wherein the method is performed under the control of a controller configured to manipulate the vision system with a vision gantry system that moves the vision system to a position defined by the calibration location.

4. The method of claim 1, wherein the substrate is an electronic substrate, said electronic substrate being supported by a support assembly that is coupled to a frame.

5. The method of claim 1, wherein the deposition unit and the vision system are coupled to a common gantry.

6. The method of claim 1, wherein the deposition unit and the vision system are provided on separate gantries.

7. The method of claim 1, further comprising dismounting the camera from the location of the deposition unit.

* * * * *